United States Patent
Yaegashi et al.

(10) Patent No.: US 7,732,873 B2
(45) Date of Patent: *Jun. 8, 2010

(54) NON-VOLATILE SEMICONDUCTOR MEMORY DEVICE AND PROCESS OF MANUFACTURING THE SAME

(75) Inventors: Toshitake Yaegashi, Yokohama (JP); Koki Ueno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/367,590

(22) Filed: Feb. 9, 2009

(65) Prior Publication Data

US 2009/0149011 A1   Jun. 11, 2009

Related U.S. Application Data

(60) Continuation of application No. 11/580,929, filed on Oct. 16, 2006, now Pat. No. 7,504,304, which is a division of application No. 10/888,986, filed on Jul. 13, 2004, now Pat. No. 7,151,295.

(30) Foreign Application Priority Data

May 18, 2004   (JP) .............................. 2004-148163

(51) Int. Cl.
   *H01L 29/76*   (2006.01)
(52) U.S. Cl. ................................ 257/396; 257/E27.103
(58) Field of Classification Search ................. 257/394, 257/395, 396, 397
   See application file for complete search history.

(56) References Cited

U.S. PATENT DOCUMENTS

| | | | |
|---|---|---|---|
| 6,222,225 B1 | 4/2001 | Nakamura et al. | |
| 6,358,796 B1 | 3/2002 | Lin et al. | |
| 6,417,073 B2 | 7/2002 | Watanabe | |
| 6,479,369 B1 | 11/2002 | Miyoshi | |
| 6,642,104 B2 | 11/2003 | Chang | |
| 6,720,610 B2 | 4/2004 | Iguchi et al. | |
| 6,768,161 B2 | 7/2004 | Kiinoshita | |
| 6,794,708 B2 | 9/2004 | Mori | |
| 6,906,378 B2 | 6/2005 | Sumino et al. | |
| 7,221,030 B2 * | 5/2007 | Saito .......................... | 257/374 |

FOREIGN PATENT DOCUMENTS

| | | |
|---|---|---|
| JP | 03-220778 | 9/1991 |
| JP | 10-335333 | 12/1998 |
| JP | 11-026728 | 1/1999 |
| JP | 2001-168306 | 6/2001 |
| JP | 2002-359308 | 12/2002 |
| JP | 2005-85996 | 3/2005 |

\* cited by examiner

*Primary Examiner*—Chandra Chaudhari
(74) *Attorney, Agent, or Firm*—Oblon, Spivak, McClelland, Maier & Neustadt, L.L.P.

(57) ABSTRACT

In device isolation trenches, a first device-isolation insulator film is formed to have recesses thereon and a second device-isolation insulator film is formed in the recesses. The uppermost portions at both ends of the first device-isolation insulator film are located higher than the uppermost portions at both ends of the second device-isolation insulator film.

9 Claims, 17 Drawing Sheets

NON-VOLATILE SEMICONDUCTOR MEMORY DEVICE AND PROCESS OF MANUFACTURING THE SAME

CROSS-REFERENCE TO PRIOR APPLICATION

This application is a continuation of and claims the benefit of priority under 35 U.S.C. §120 from U.S. patent application Ser. No. 11/580,929, filed on Oct. 16, 2006, which is a division of U.S. patent application Ser. No. 10/888,986, filed on Jul. 13, 2004 and claims the benefit of priority under 35 U.S.C. §119 of Japanese Patent Application No. 2004-148163, filed on May 18, 2004, the entire content of which is incorporated herein by reference.

BACKGROUND OF THE INVENTION

1. Field of the Invention

The present invention relates to a non-volatile semiconductor memory device and process of manufacturing the same, and more particularly to a structure of a device isolation insulator film for defining device formation regions.

2. Description of the Related Art

An electrically erasable programmable non-volatile semiconductor memory device (EEPROM) of the so-called floating gate type causes a problem associated with an increase in capacitive coupling between floating gates. For the purpose of solution of this problem, a known technology is employed to etch a device-isolation insulator film formed between the floating gates to form a recess therein so that a control gate can be buried deeply in between the floating gates. Such the technology is disclosed, for example, in JP-A 2001-168306 (paragraphs from [0032] through [0041] and FIG. 17).

This technology is described with reference to FIG. 30, in which a semiconductor substrate 11 has a plurality of device formation regions 12. Adjacent device formation regions 12 are defined by a device isolation trench 13. Buried in the device isolation trench 13 is a device-isolation insulator film 14 for electrically isolating memory cells from each other, which are formed in the device formation regions 12. On the device formation region 12, in turn from below, a lower gate insulator film (tunnel insulator film) 21, a floating gate 22, a second gate insulator film (ONO film) 23, and a control gate 26 composed of a polysilicon film 26a and a tungsten suicide film (WSi film) 26b are formed to configure a single memory cell. At the center of the device-isolation insulator film 14, a recess 14v is formed by etching to fill the control gate 26 also in the recess 14v. Thus, capacitive coupling between the floating gates 22 can be reduced.

The technology disclosed in JP-A 2001-168306 requires etching of the device-isolation insulator film 14 with a spacer mask formed on the sidewall of the floating gate 22 to form the recess 14v in the device-isolation insulator film 14. Accordingly, there is a problem because process steps are increased by the step of forming the spacer mask. In particular, with the progress of fine patterning, the device-isolation insulator film 14 may have a narrow width. In such the case, there is another problem because the control gate 26 is hardly buried in the recess 14v and the capacitive coupling between the floating gates 22 cannot be reduced easily.

SUMMARY OF THE INVENTION

The present invention provides a non-volatile semiconductor memory device, comprising: a semiconductor substrate having device formation regions defined by device isolation trenches; a first gate insulator film formed over the device formation regions; a floating gate formed on the first gate insulator film; a first device-isolation insulator film formed in the device isolation trenches and having recesses thereon; a second device-isolation insulator film formed in the recesses; a second gate insulator film formed over a surface of the floating gate and the first and second device-isolation insulator films; and a control gate formed above the floating gate and the first and second device-isolation insulator films via the second gate insulator film, wherein the uppermost portions at both ends of the first device-isolation insulator film are located higher than the uppermost portions at both ends of the second device-isolation insulator film.

The present invention provides a process of manufacturing non-volatile semiconductor memory devices, comprising the steps of: forming device isolation trenches in a semiconductor substrate for defining device formation regions to form non-volatile semiconductor devices; forming a first device-isolation insulator film for electrically isolating the device formation regions from each other in the device isolation trench with such a thickness that forms a first recess in the first device-isolation insulator film; forming a second device-isolation insulator film for electrically isolating the device formation regions from each other to fill the recess; planarizing the first device-isolation insulator film and the second device-isolation insulator film; etching the first device-isolation insulator film and the second device-isolation insulator film on condition that the second device-isolation insulator film is higher in etching rate than the first device-isolation insulator film such that the uppermost portions at both ends of the first device-isolation insulator film are located higher than the uppermost portions at both ends of the second device-isolation insulator film to form a second recess; forming an upper gate insulator film on a surface of a floating gate material film and in the second recess, the floating gate material film being formed on a lower gate insulator film above the device formation region; and forming a control gate material film on the upper gate insulator film.

DETAILED DESCRIPTION OF THE PREFERRED EMBODIMENTS

A first embodiment of the present invention will now be described in detail with reference to the drawings.

First Embodiment

Figure 1:
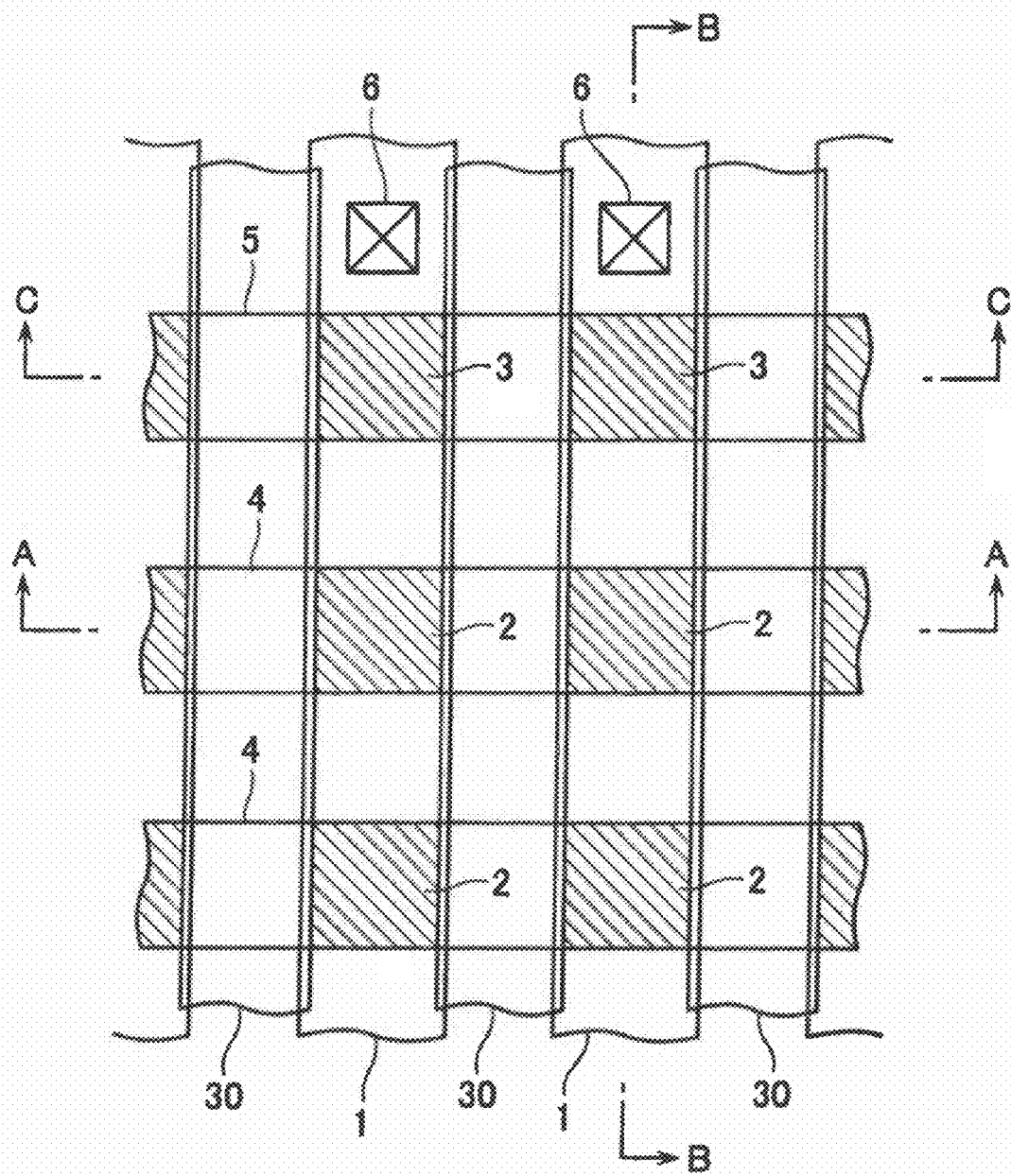
FIG. 1 shows a layout of a cell array in an NAND-type EEPROM according to a first embodiment of the present invention.
Figure 2A:
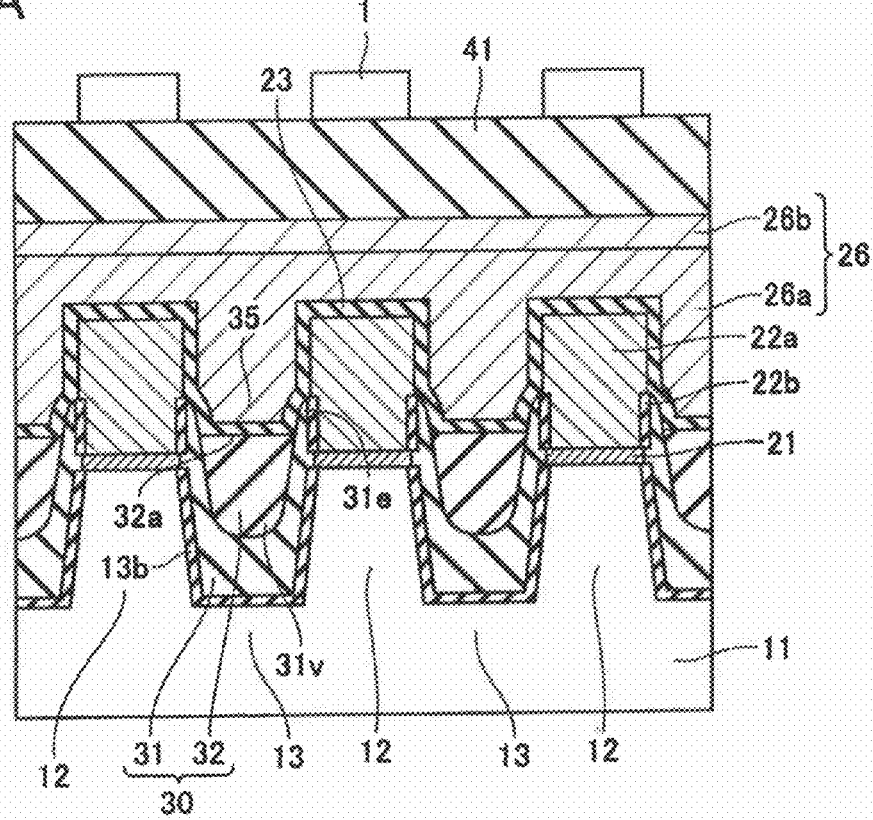
FIG. 2A is a view of A-A section in FIG. 1, showing a structure of memory cells 2 and selection transistors 3.
Figure 2B:
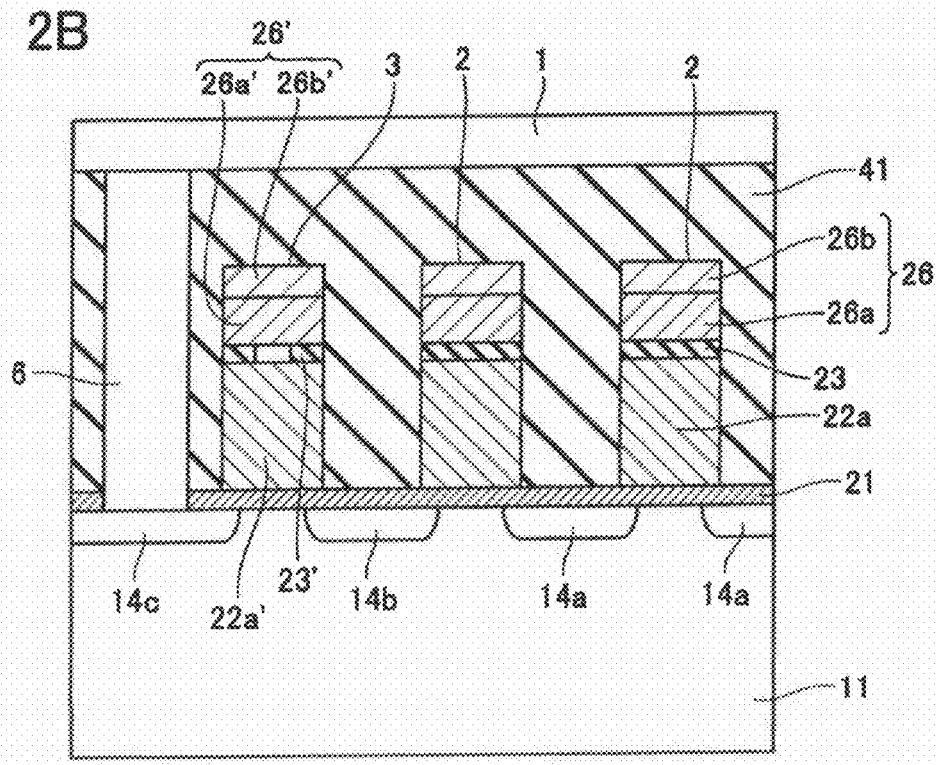
FIG. 2B is a view of B-B section in FIG. 1, showing a structure of memory cells 2 and selection transistors 3.

FIG. 1 shows a layout of a cell array in an NAND-type EEPROM according to the first embodiment of the present invention, and FIGS. 2A and 2B are views of A-A and B-B sections in FIG. 1.

As shown in FIG. 1, the memory cell array in the NAND-type EEPROM includes a plurality of memory cells 2 and a selection transistor 3, which are connected in serial along a bit line 1. A plurality of memory cells 2 arranged in the direction of a word line are connected to a common control gate line (word line) 4, and selection transistors 3 are connected to a common selection gate line 5. Each selection transistor 3 is connected via a bit line contact 6 to a bit line 1.

As shown in FIG. 2A, the memory cell array includes device formation regions 12 formed on a silicon substrate 11, which are defined by device isolation trenches 13. A gate of the memory cell 2 and a gate of the selection transistor 3 are formed on the device formation region 12. As shown in FIG. 2B, two memory cells 2 adjacent to each other in the direction of the bit line 1 share a source-drain diffusion layer 14a on the silicon substrate 11. Similarly, a memory cell 2 and a selection transistor 3 adjacent thereto in the direction of the bit line 1 share a source-drain diffusion layer 14b on the substrate 11.

In addition, two opposite selection transistors 3 sandwiching a bit line contact 6 therebetween share a source-drain diffusion layer 14c on the substrate 11.

In each device formation region 2, a floating gate 22a is formed on a first gate insulator film 21 (lower gate insulator film) that is a tunnel insulator film. Above the floating gate 22a, a control gate 26 is formed on a second gate insulator film 23 (upper gate insulator film). The control gate 26 has a double-layered structure of a polysilicon film 26a and a tungsten silicide (WSi) film 26b. Materials of the films 26a and 26b are not limited to polysilicon and tungsten silicide. For example, a polysilicon silicide film may also be available. The floating gate 22a, the first gate insulator film 21 and the device isolation trench 13 have aligned sides because they are patterned simultaneously as described later.

An insulator film 13b is formed on inner walls (bottom and sides) in the device isolation trench 13 and an insulator film 22b is formed on sides of the floating gate 22a. A device-isolation insulator film 30 is formed inside the device isolation trench 13. The device-isolation insulator film 30 includes a first device-isolation insulator film 31 and a second device-isolation insulator film 32. The first device-isolation insulator film 31 has extensions 31e at both left and right sides, as shown in FIG. 2A, which contact with the insulator films 13b and 22b formed along the inner walls in the device isolation trench 13. The first device-isolation insulator film 31 has a recess 31v at the center to form such a concave shape that the extensions 31e at both left and right sides have the highest height(s). The upper ends of the extensions 31e are formed such that they are located higher than the lower surface of the floating gate 22a and lower than the upper surface of the floating gate 22a and adjacent to the floating gate 22a via the insulator film 22b.

The second device-isolation insulator film 32 is formed so as to almost fill the recess 31v in the first device-isolation insulator film 31. The uppermost portion of the first device-isolation insulator film 31 (the upper end of the extension 31e) is located higher than the uppermost portion of the second device-isolation insulator film 32 (the upper surface 32a). Thus, the device-isolation insulator film 30 is provided with a concave thereon to bury the control gate 26 therein.

The control gate 26 is continuously patterned, spanning a plurality of the device formation regions 12 in a direction perpendicular to the bit line as shown in FIG. 2A, to configure the control gate line (word line) 4. As described above, the height of the extension 31e is determined lower than the upper surface of the floating gate 22a, and the upper surface 32a is determined further lower than that height. Therefore, the control gate 26 is not only formed on the floating gate 22 but also buried in the concave between the floating gates 22. This is effective to reduce capacitive coupling between adjacent floating gates 22.

As shown in FIG. 2B, the selection transistor 3 includes a gate 22a', an insulator film 23', and a selection gate line 26' (films 26a' and 26b'). The gate 22a', the insulator film 23', and the films 26a' and 26b' are composed of the same material films as those of the portions 22a, 23, 26a and 26b of the memory cell 2, respectively. The selection gate line 26' is directly connected (short-circuited) to the gate 22a' by removing part of the second insulator film 23'.

Specific steps of processing the NAND-type EEPROM according to the present embodiment will be described with reference to FIGS. 3-12B.

Figure 3:
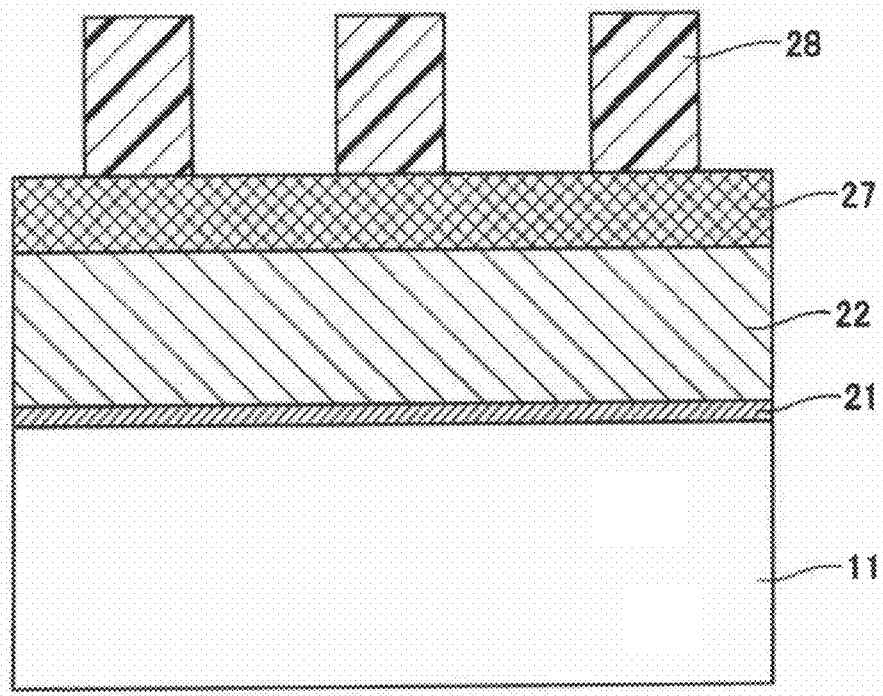
FIG. 3 shows a specific step of processing the NAND-type EEPROM according to the first embodiment.

First, as shown in FIG. 3, a 10 nm-thick silicon oxide film is formed as the first gate insulator film 21 on the silicon substrate 11. Then, a polysilicon film 22 with a thickness of approximately 160 nm is deposited on the film 21 as a material film for the floating gate 22 by a low pressure CVD (Chemical Vapor Deposition) method. Further, a silicon nitride film 27 with a thickness of approximately 90 nm is formed as a stopper film for use in a CMP (chemical mechanical polishing) process by a low pressure CVD method. Subsequently, a photoresist pattern 28 is formed on the silicon nitride film 27 using a photolithography technology.

Figure 4:
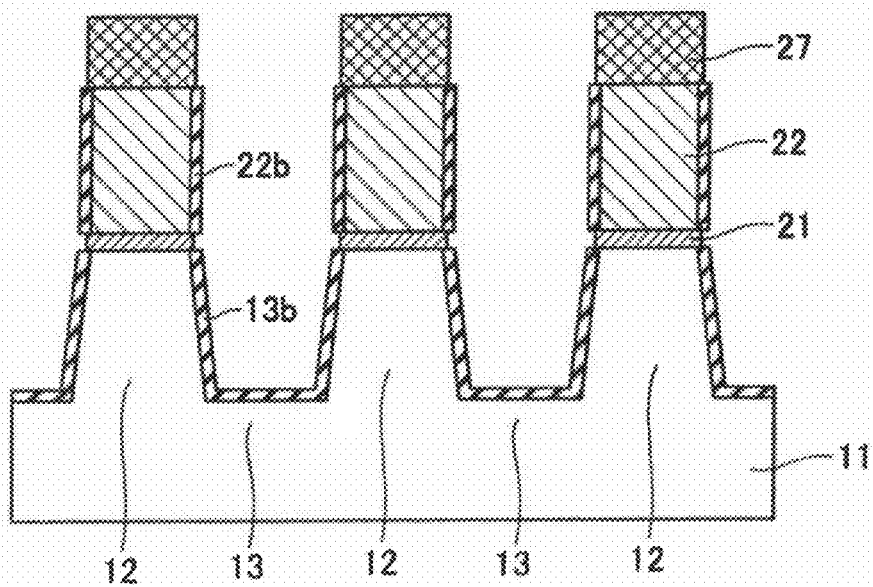
FIG. 4 shows a specific step of processing the NAND-type EEPROM according to the first embodiment.

Next, as shown in FIG. 4, the silicon nitride film 27, the polysilicon film 22, the first gate insulator film 21, and the silicon substrate 11 are subjected to etching with a mask of the photoresist pattern 28. This results in formation of the device formation regions 12 for forming the memory cells 2 therein and the device isolation trenches 13 for defining the regions. In exemplary dimensions, the device isolation trench has a depth of approximately 220 nm from the upper surface of the polysilicon film 22 and a width of approximately 70 nm at the upper portion. As the polysilicon film 22, the first gate insulator film 21 and the device formation region 12 are patterned with the mask of the same photoresist pattern 28, they have aligned sides. Thereafter, for removal of etching damages, thermal oxidation is applied to form the silicon oxide film 22b on the side of the polysilicon film 22, and the silicon oxide film 13b on the side and bottom in the device isolation trench 13.

Figure 5:
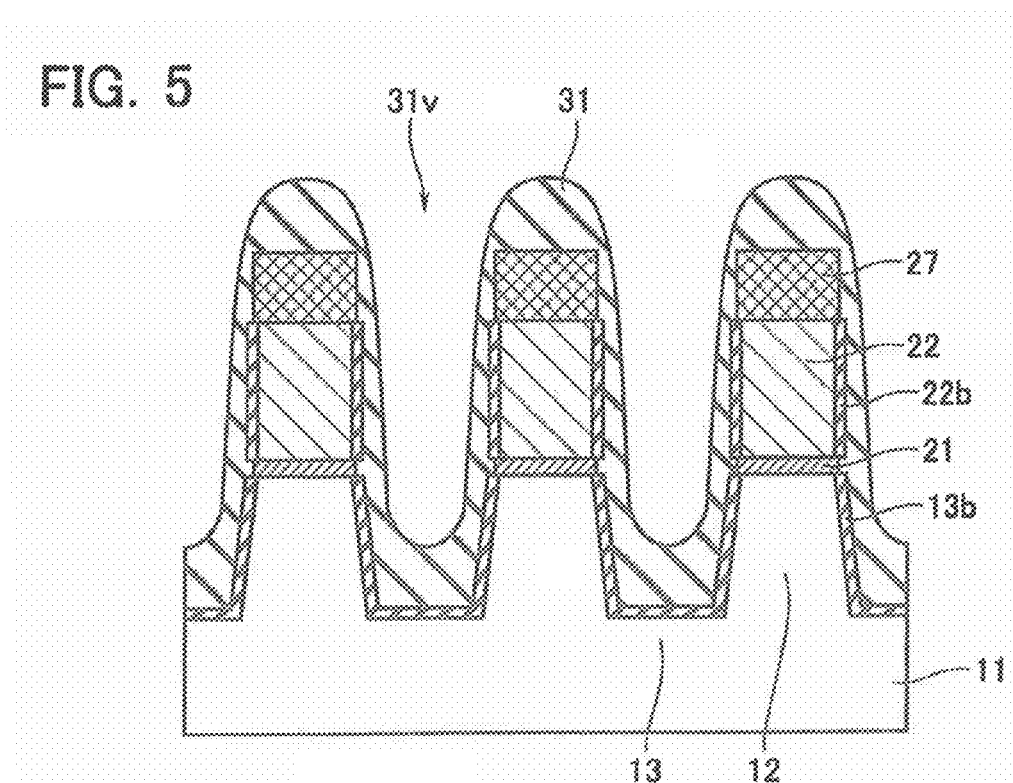
FIG. 5 shows a specific step of processing the NAND-type EEPROM according to the first embodiment.

Then, as shown in FIG. 5, the silicon oxide film is deposited over the entire surface using a plasma CVD method as the first device-isolation insulator film 31 to be buried in the device isolation trenches 13. The entire surface includes not only inside the device isolation trenches 13 but also on the silicon nitride film 27 formed above the device formation regions 12. The first device-isolation insulator film 31 is controlled to have a thickness below one-half of the width of the device isolation trench 13 in a flat region, not shown, such that the device isolation trench 13 is not filled flat and is provided with the recess 31v formed therein. In this embodiment, as the device isolation trench 13 has a width of 70 mm, the first device-isolation insulator film 31 is determined to have a thickness of about 20 nm in a flat region, not shown.

Figure 6:
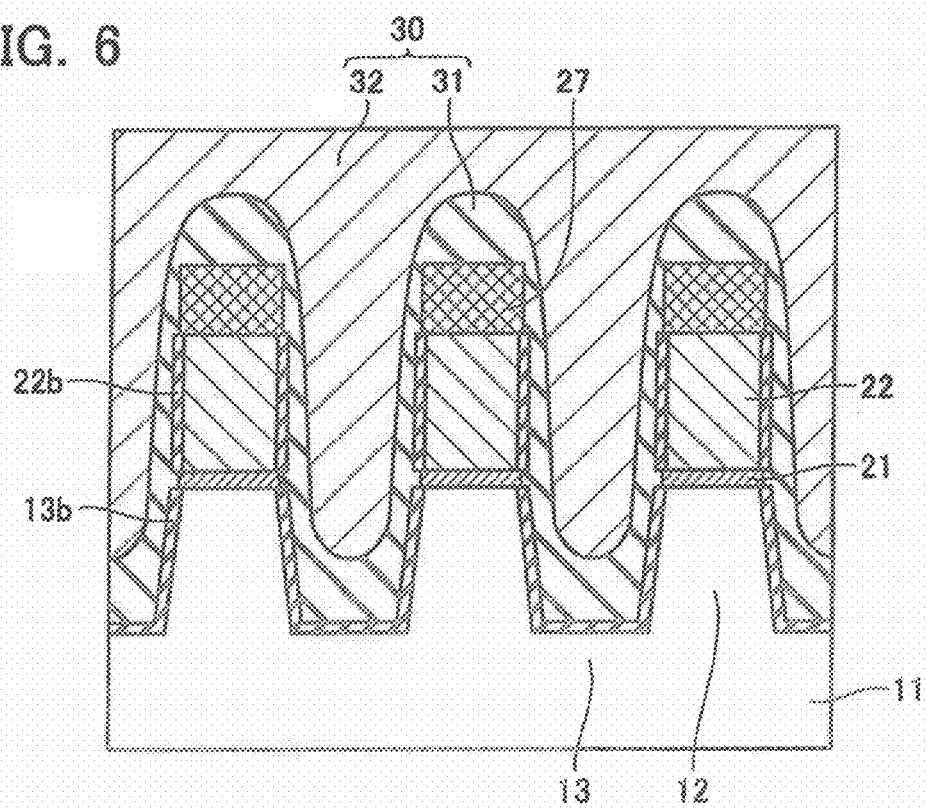
FIG. 6 shows a specific step of processing the NAND-type EEPROM according to the first embodiment.

Then, as shown in FIG. 6, the second device-isolation insulator film 32 is deposited on the first device-isolation insulator film 31, filling the recesses 31v without remaining any space. The deposition of the second device-isolation insulator film 32 is achieved by applying polysilazane over the entire surface of the first device-isolation insulator film 31 including the inside of the recess 31v, and densifying the polysilazane by heating in a steam-added oxidative ambient. This method is effective to fill the recess 31v easily even if the recess 31v is narrow and deep.

Figure 7:
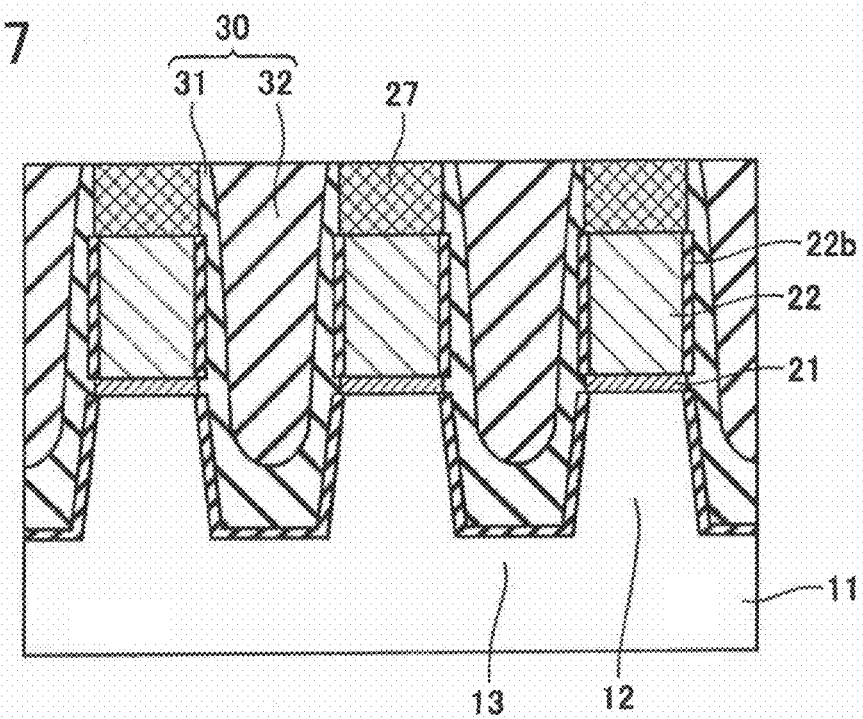
FIG. 7 shows a specific step of processing the NAND-type EEPROM according to the first embodiment.

Next, as shown in FIG. 7, using the silicon nitride film 27 as a stopper film, a CMP method is applied to remove/pla-narize the first device-isolation insulator film 31 and the second device-isolation insulator film 32 to the upper surface of the silicon nitride film 27.

Figure 8:
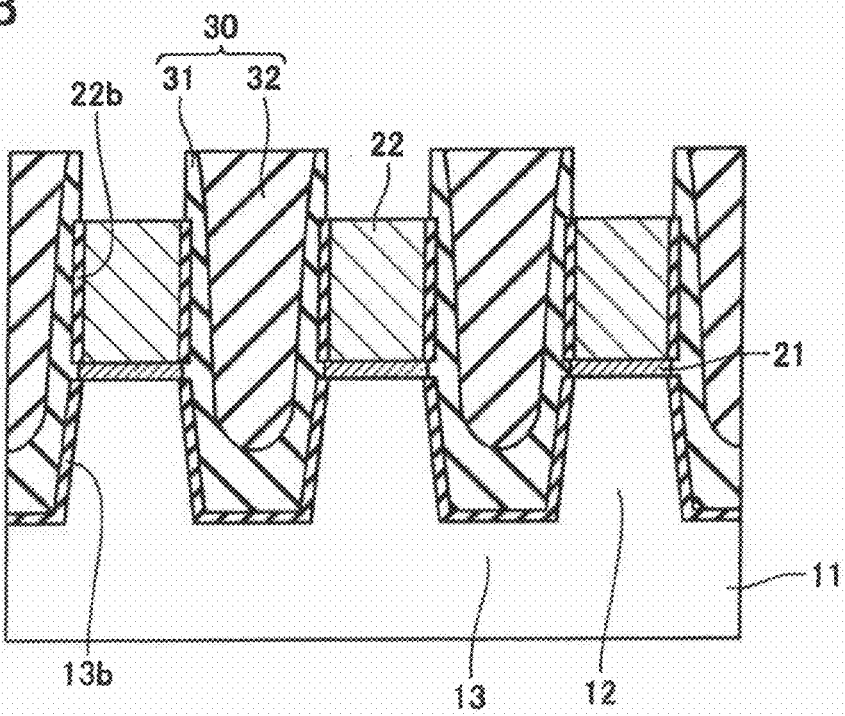
FIG. 8 shows a specific step of processing the NAND-type EEPROM according to the first embodiment.

Then, as shown in FIG. 8, a phosphoric acid treatment at 150° C. is employed to remove the silicon nitride film 27 to expose the upper surface of the polysilicon film 22.

Figure 9:
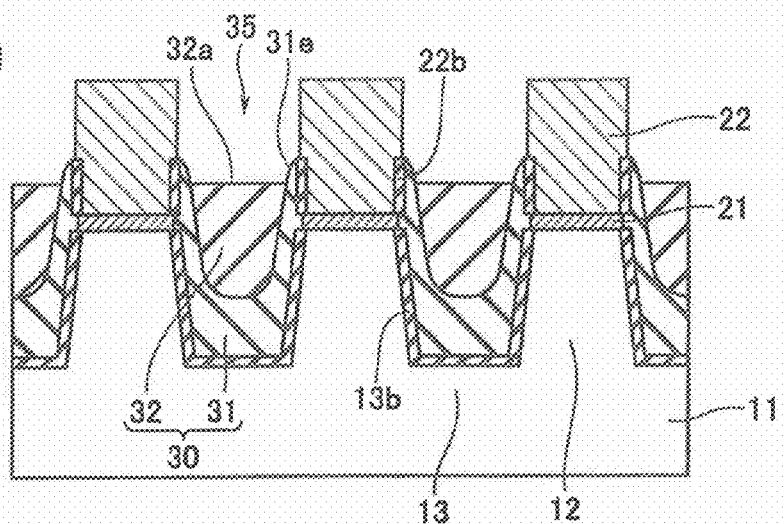
FIG. 9 shows a specific step of processing the NAND-type EEPROM according to the first embodiment.

Thereafter, as shown in FIG. 9, the first device-isolation insulator film 31 and the second device-isolation insulator film 32 are partly removed by etching to form the concave between the portions of the polysilicon film 22. The etching is a selective etching, in which the polysilazane of the second device-isolation insulator film 32 has a higher etching rate than that of the silicon oxide of the first device-isolation insulator film 31. In this embodiment, the etching is performed using a buffer hydrofluoric acid (a mixed solution of hydrofluoric acid and ammonium fluoride). The use of the buffer hydrofluoric acid is effective to increase a ratio of etching rate of polysilazane to that of silicon oxide (selection ratio).

A vapor of hydrofluoric acid may be employed instead of the buffer hydrofluoric acid:

The etching gradually proceeds from the upper portions of the insulator films 31 and 32, though the difference in etching rate retains the height of the extension 31e of the first device-isolation insulator film 31 higher than that of the upper. surface 32a of the second device-isolation insulator film 32. Thus, the etching is continued until the upper end of the extension 31e locates between the upper and lower ends of the polysilicon film 22 (to partly expose the side of the polysilicon film 22), and the upper surface 32a locates slightly higher than the first gate insulator film 21. The difference in height between the upper surface 32a and the upper end of the extension 31e can be changed through adjustment of the etching condition.

The location of the upper end of the extension 31e controlled higher than the upper surface 32a of the second device-isolation insulator film 32 can reduce capacitive coupling between the floating gates 22a and keep a high breakdown voltage across the control gate 26 and the semiconductor substrate 11.

Figure 10:
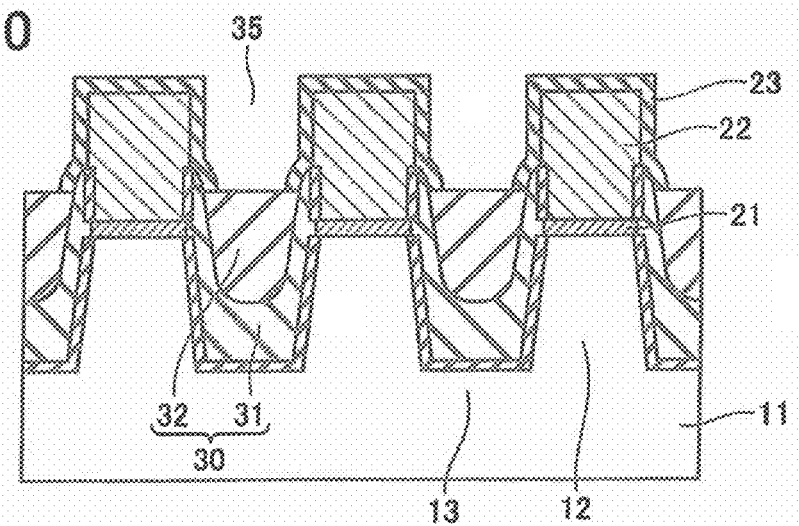
FIG. 10 shows a specific step of processing the NAND-type EEPROM according to the first embodiment.

Then, as shown in FIG. 10, as the second gate insulator film 23, a certain thick ONO film is formed on the upper surface and sides of the polysilicon film 22 and on the first device-isolation insulator film 31 and the second device-isolation insulator film 32 (that is, over the inner surface in the concave 35) using a low pressure CVD method. The ONO film is an insulator film having a triple-layered structure of a first silicon oxide film, a silicon nitride film and a second silicon oxide film laminated in turn. In the region for forming the selection transistor 3 therein, the second gate insulator film 23 is partly removed to short-circuit between the polysilicon film 22 and the control gate 26.

Figure 11:
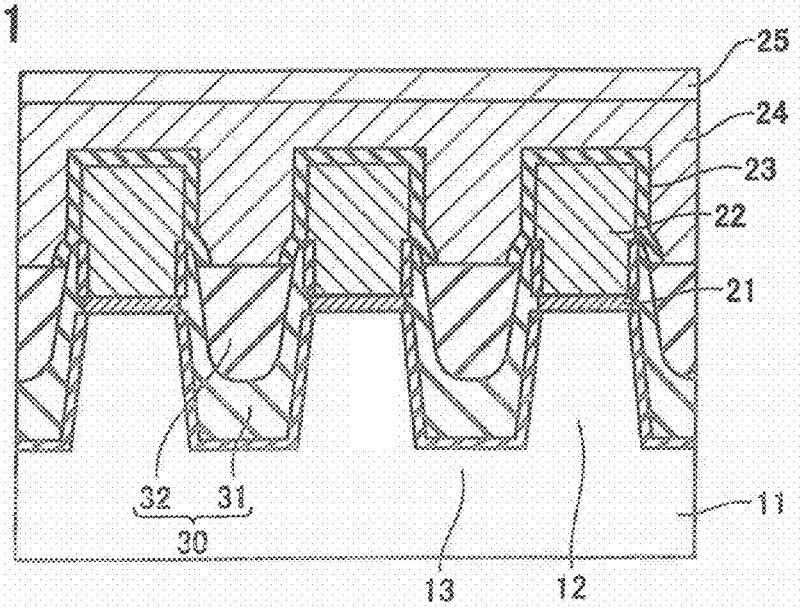
FIG. 11 shows a specific step of processing the NAND-type EEPROM according to the first embodiment.

Subsequently, as shown in FIG. 11, a polysilicon film 24 and a tungsten silicide film 25 are formed on the second gate insulator film 23 in turn as the material for the control gate 26. Specifically, a low pressure CVD method is applied to form a phosphorus (P)-doped polysilicon film 24 with a thickness of about 80 nm followed by a spattering method to form a tungsten silicide film 25 with a thickness of about 85 nm.

Figure 12A:
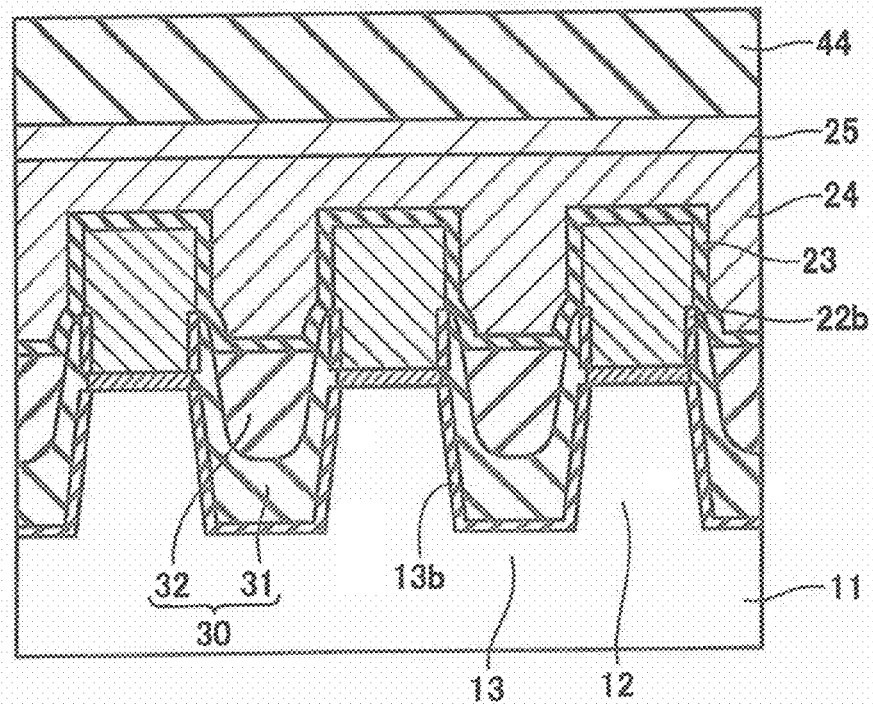
FIG. 12A shows a specific step of processing the NAND-type EEPROM according to the first embodiment.
Figure 12B:
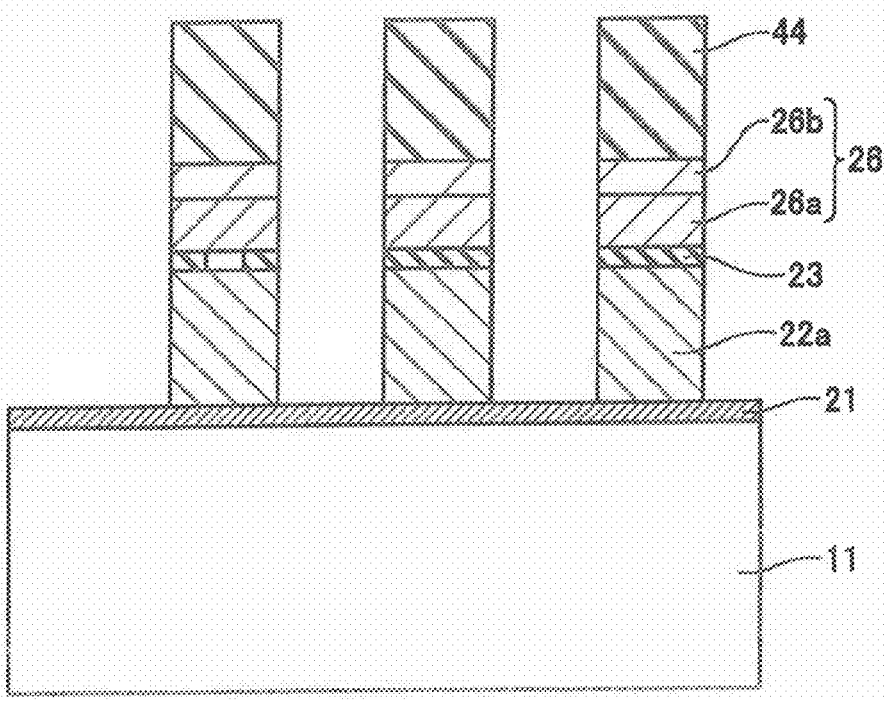
FIG. 12B shows a specific step of processing the NAND-type EEPROM according to the first embodiment.

Next, as shown in FIG. 12A, a mask pattern 44 of silicon nitride film is formed. This mask pattern 44 is obtained by forming a silicon nitride film with a thickness of about 300 nm on the tungsten silicide film 25 by low pressure CVD; then forming a resist pattern (not shown) on the silicon nitride film; and etching the silicon nitride film with a mask of the resist pattern. The mask pattern 44 extends in a direction perpendicular to the direction of the device isolation trench 13 extending. Subsequently, the tungsten silicide film 25, the polysilicon film 24, the second gate insulator film 23, and the polysilicon film 22 are patterned with an etching mask of the mask pattern 44. As a result, as shown in FIG. 12B, the polysilicon film 22 is shaped in the form of the floating gate 22a in each memory cell 2. In addition, the polysilicon films 24 and 25 are shaped in the forms of the films 26a and 26b contained in the control gate 26.

Thereafter, removal of the silicon nitride film 44 by phosphoric acid treatment; formation of the source-drain diffusion layers 14a, 14b and 14c by ion implantation and thermal diffusion; formation of an interlayer insulator film 41 by low pressure CVD; and formation of the bit lines 1 are performed to complete the cell array in the NAND-type EEPROM as shown in FIGS. 1, 2A and 2B.

Thus, in the present embodiment, formed inside the recess 31v in the first device-isolation insulator film 31 to be the device-isolation insulator film is the second device-isolation insulator film 32 also to be the device-isolation insulator film 30. Then, part of the first device-isolation insulator film 31 and part of the second device-isolation insulator film 32 are removed to form the concave 35 on such the etching condition that the film 32 has a higher etching rate than that of the film 31. The concave 35 can be formed in a manner of self-alignment using the difference in etching rate between the films 31 and 32. Namely, for the formation of the concave 35, the present embodiment requires no spacer mask formed on the sidewall of the polysilicon film 22. Accordingly, it can simplify the process steps. In addition, as the thickness of the extension 31e in the lateral direction is small, the spread of the concave 35 has almost the same dimension as the width of the device isolation trench 13. Therefore, even if the width of the device isolation trench 13 is narrowed, the progress of fine patterning can sufficiently widen the width of the concave 35 to ensure the control gate 26 to be buried in the concave 35. Accordingly, the capacitive coupling across the floating gates 22 can be reduced effectively. The adjustment of the difference in etching rate (selection ratio) can control the width and depth of the concave 35 easily and reliably. The extensions 31e at both sides of the first device-isolation insulator film 31 protrude beyond the second device-isolation insulator film 32. This is effective to retain a high breakdown voltage between the control gate 26 and the semiconductor substrate 11 even if the concave 35 has a larger depth such that the control gate 26 is buried deeper.

Figure 13:
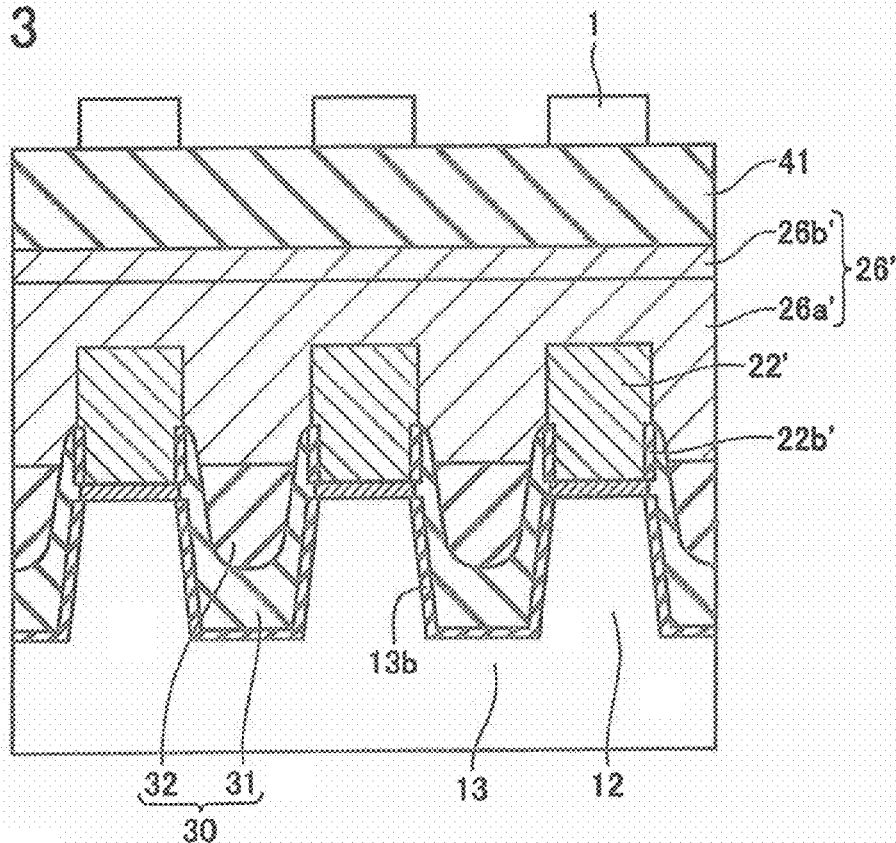
FIG. 13 is a cross-sectional view taken along C-C in FIG. 1, showing a structure of selection transistors in the NAND-type EEPROM according to the first embodiment.

A sectional structure of the selection transistor 3 (C-C section in FIG. 1) is described with reference to FIG. 13. Different from the memory cell 2, the selection transistor 3 is structured such that the second gate insulator film 23 is partly removed to short-circuit between the polysilicon film 22' and the control gate 26'. The device isolation trench 13 continues from the region for forming the memory cell 2. The device-isolation insulator film 30 composed of the first device-isolation insulator film 31 and the second device-isolation insulator film 32 also has the same structure that continues from the region for forming the memory cell 2.

Figure 14:
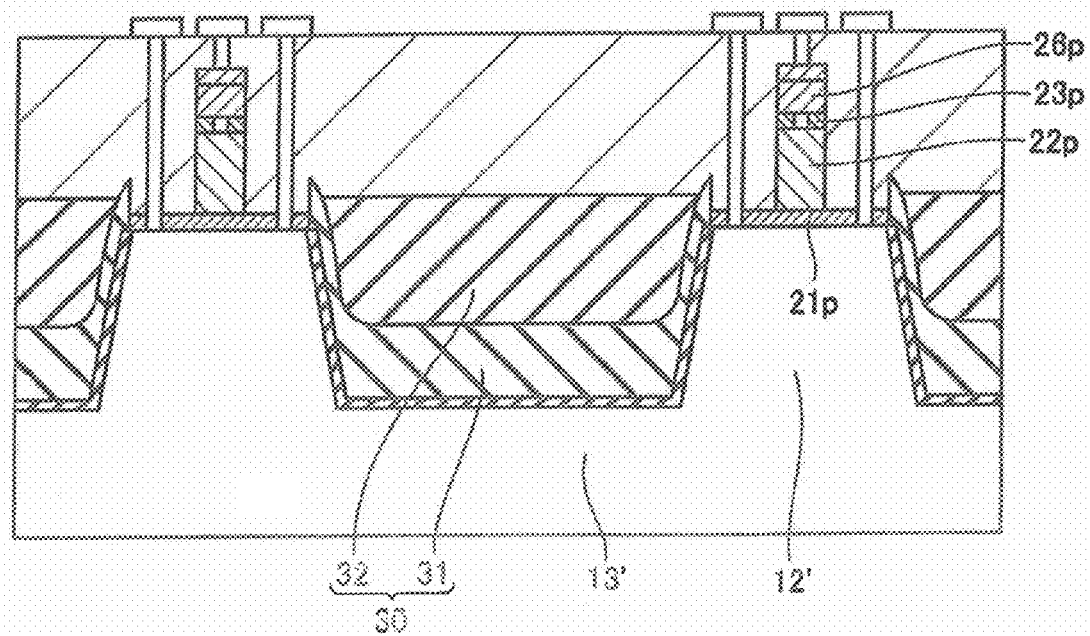
FIG. 14 shows a structural example of transistors for configuring a peripheral circuit in the NAND-type EEPROM according to the first embodiment.

A structural example of transistors for configuring a peripheral circuit in the NAND-type EEPROM according to the present embodiment is described with reference to FIG. 14. A transistor contained in the peripheral circuit has a gate, which is composed of a first gate insulator film 21p, a polysilicon film 22p, a second gate insulator film 23p and a polysilicon film 26p. These components may be composed of the same films as those of the portions 21, 22a, 23 and 26 in the memory cell. The second gate insulator film 23p is partly removed by, for example, etching to short-circuit between the polysilicon film 26p and the polysilicon film 22p. This structure is same as that of the selection transistor 3. The device-isolation insulator film 30 formed in a device isolation trench 13' for defining a device region 12' of the transistor contained in the peripheral circuit is formed simultaneously with that in the memory cell region and has the same structure as that of the memory cell region. Namely, the first device-isolation insulator film 31 is shaped in the form of a recess, and the second device-isolation insulator film 32 is formed in the recess.

Second Embodiment

A second embodiment of the present invention will now be described with reference to the drawings.

Figure 15A:
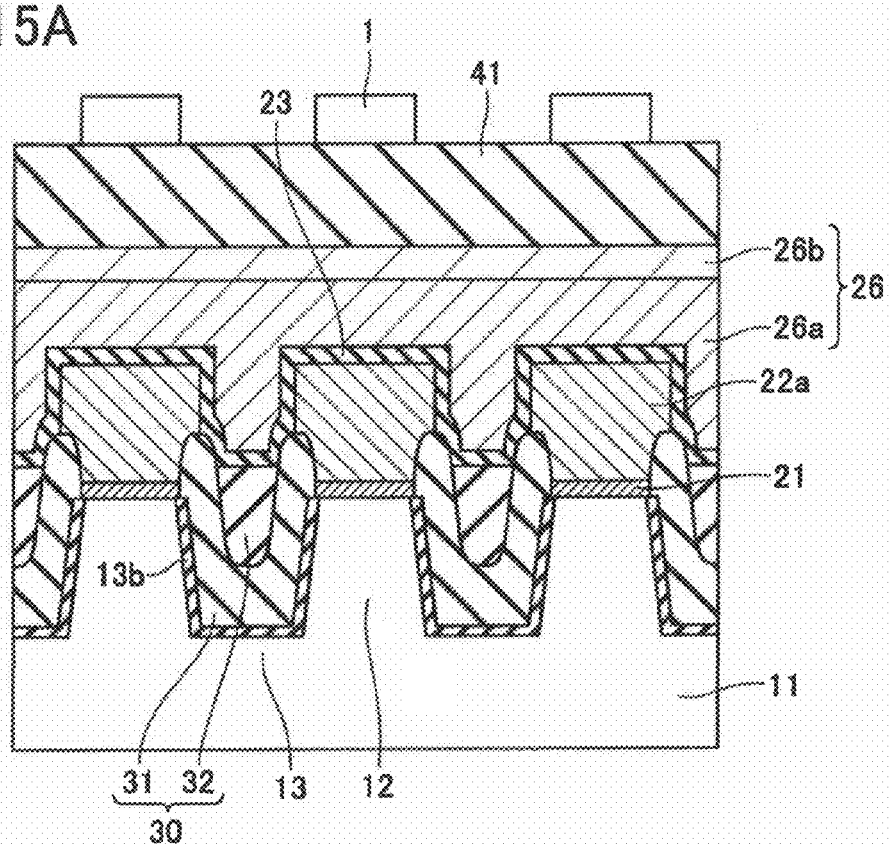
FIG. 15A shows a structure of memory cells 2 and selection transistors 3 in an NAND-type EEPROM according to a second embodiment of the present invention (a view of A-A section in FIG. 1)
Figure 15B:
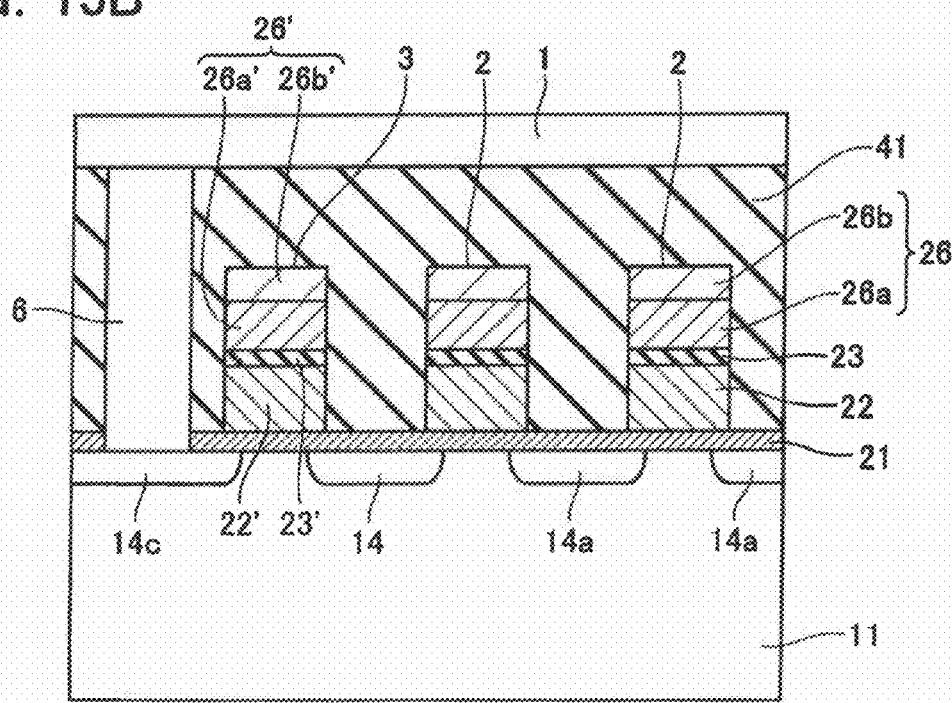
FIG. 15B shows a structure of memory cells 2 and selection transistors 3 in the NAND-type EEPROM according to the second embodiment of the present invention (a view of B-B section in FIG. 1)

In this embodiment the NAND-type EEPROM has a cell array of the same layout as is shown in FIG. 1 with views of A-A and B-B sections being shaped as shown in FIGS. 15A and 15B. In the first embodiment the floating gate 22a has a side aligned with those of the first gate insulator film 21 and the device isolation trench 13. To the contrary, in the second embodiment, these sides are not aligned with each other. Though, the extension 31e of the device-isolation insulator film 31 and the upper surface 32a of the device-isolation insulator film 32 may have the same positional relation as in the first embodiment.

The steps of processing the NAND-type EEPROM according to the second embodiment will be described with reference to FIGS. 16-25B.

Figure 16:
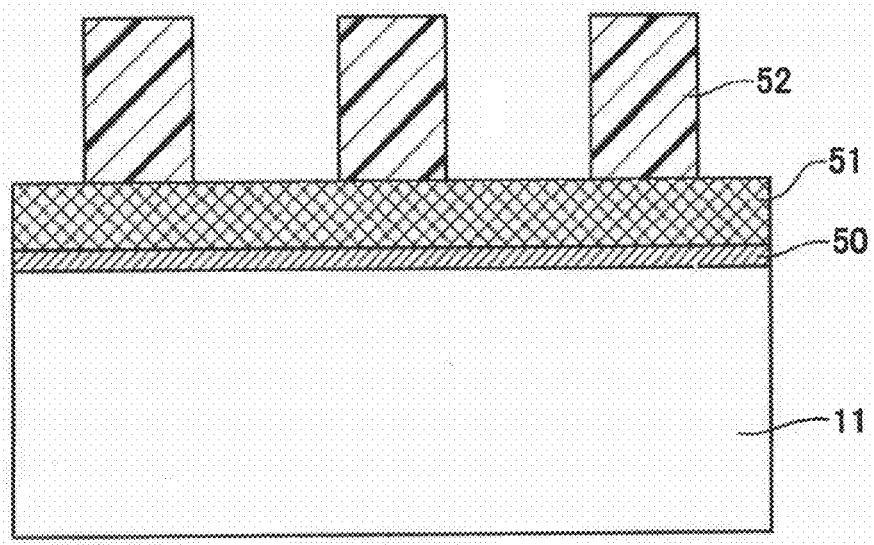
FIG. 16 shows a specific step of processing the NAND-type EEPROM according to the second embodiment.

First, as shown in FIG. 16, a silicon oxide film 50 with a thickness of approximately 10 nm is formed as a buffer oxide film on the silicon substrate 11 by thermal oxidation. Then, as a stopper film for use in a CMP process, a silicon nitride film 51 with a thickness of approximately 90 nm is deposited on the film 50 by a low pressure CVD method. Subsequently, a photolithography technology is employed to form a photoresist pattern 52 on the silicon nitride film 51.

Figure 17:
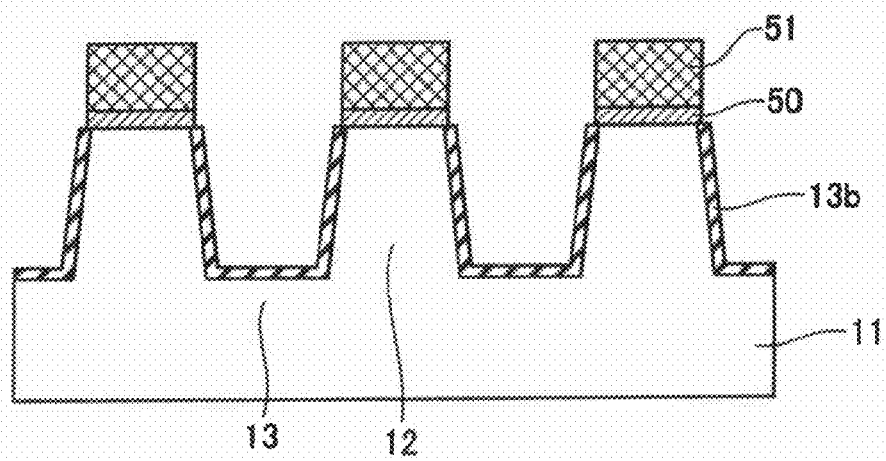
FIG. 17 shows a specific step of processing the NAND-type EEPROM according to the second embodiment.

Next, as shown in FIG. 17, the photoresist pattern 52 is employed as an etching mask to etch the silicon nitride film 51, the silicon oxide film 50 and the silicon substrate 11. This results in the device formation regions 12 for forming the memory cells 2 therein and the device isolation trenches 13 for defining the regions 12. Then, for removal of etching damages, the silicon nitride film 13b is formed on the side and bottom in the device isolation trench 13 by thermal oxidation.

Figure 18:
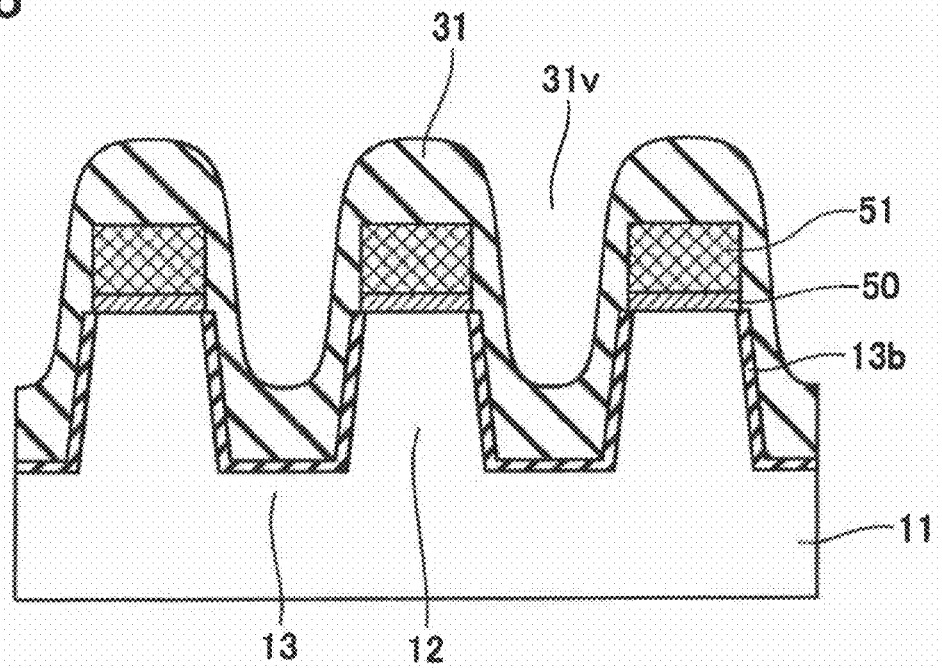
FIG. 18 shows a specific step of processing the NAND-type EEPROM according to the second embodiment.

Thereafter, as shown in FIG. 18, as the first device-isolation insulator film 31 to be buried in the device isolation trench 13, a silicon oxide film is deposited by a plasma CVD method over the entire surface including the inside of the device isolation trench 13. Like in the first embodiment, the thickness of the film is similarly determined (for example, below one-half of the width of the device isolation trench 13) to form the recess 31v.

Figure 19:
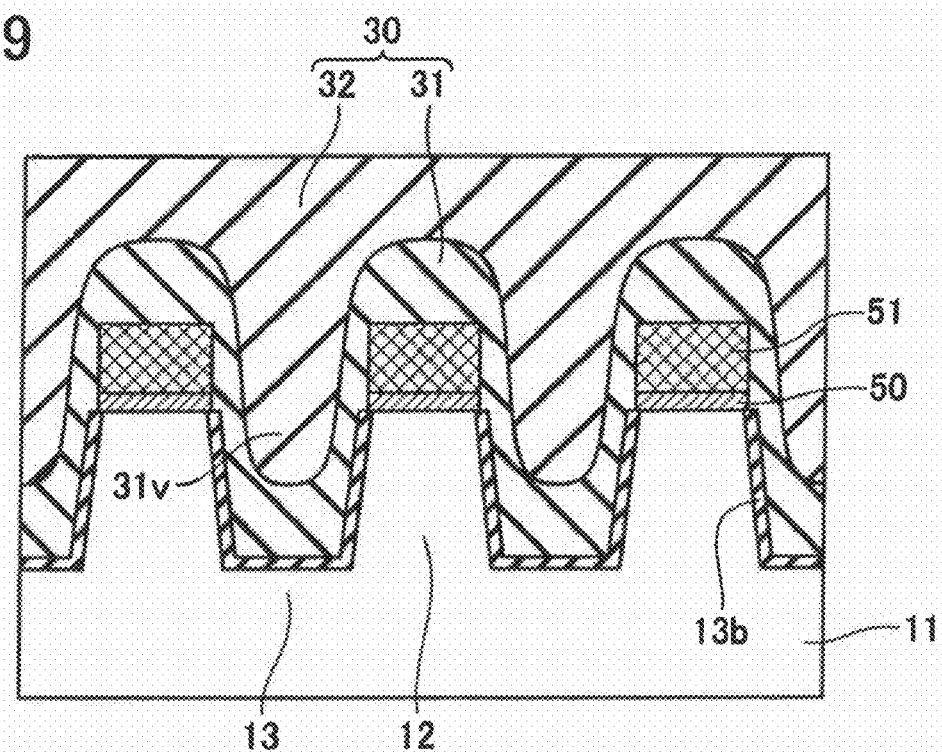
FIG. 19 shows a specific step of processing the NAND-type EEPROM according to the second embodiment.

Next, as shown in FIG. 19, the second device-isolation insulator film 32 is deposited over the first device-isolation insulator film 31 to fill the recess 31v without remaining any space. Like in the first embodiment, the second device-isolation insulator film 32 can be formed through (1) the step of applying polysilazane over the entire surface, and (2) the step of densifying the polysilazane by heating in a steam-added oxidative ambient.

Figure 20:
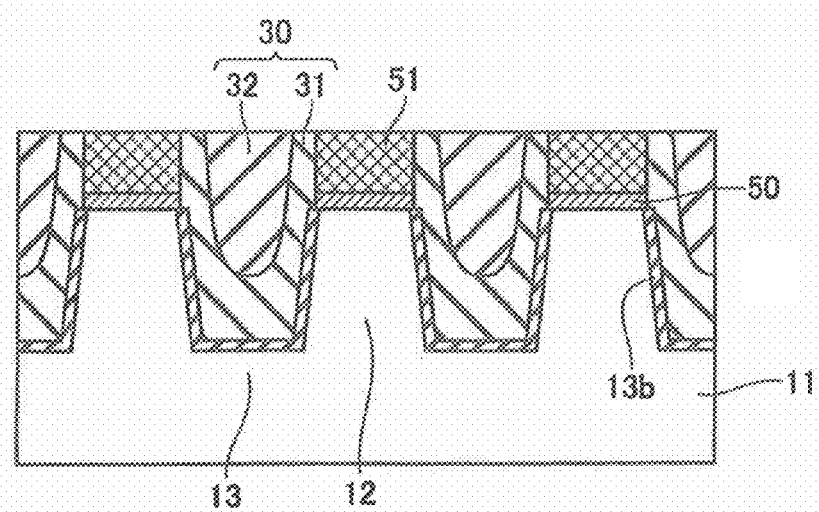
FIG. 20 shows a specific step of processing the NAND-type 5 EEPROM according to the second embodiment.
Figure 21:
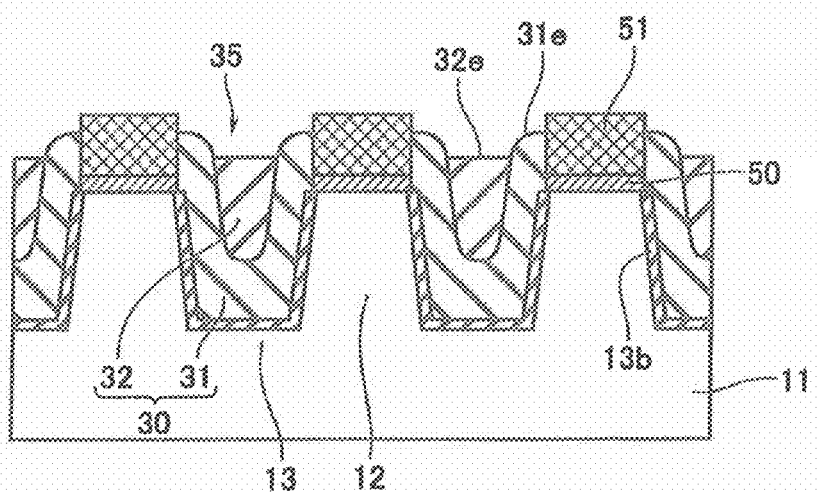
FIG. 21 shows a specific step of processing the NAND-type EEPROM according to the second embodiment.

Subsequently, as shown in FIG. 20, using the silicon nitride film 51 as a stopper film, a CMP method is applied to remove/planarize the first device-isolation insulator film 31 and the second device-isolation insulator film 32 to the upper surface of the silicon nitride film 51. Then, as shown in FIG. 21, the first device-isolation insulator film 31 and the second device-isolation insulator film 32 are partly removed by etching. Like in the first embodiment, the ratio of etching rate (selection ratio) of polysilazane (material for forming the second device-isolation insulator film 32) to silicon oxide (material for forming the first device-isolation insulator film 31) is increased. As a result, the uppermost portion of the first device-isolation insulator film 31 or the upper end of the extension 31e is located higher than the upper surface 32e of the second device-isolation insulator film 32. Thus, the etching is continued until the upper end of the extension 31e locates between the upper and lower ends of the polysilicon film 51 and the upper surface 32e locates slightly higher than the first gate insulator film 21.

Figure 22:
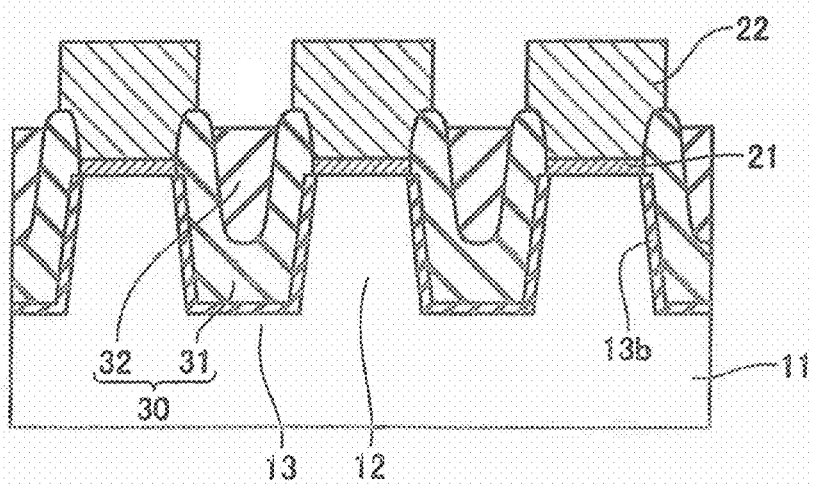
FIG. 22 shows a specific step of processing the NAND-type EEPROM according to the second embodiment.

Subsequently, as shown in FIG. 22, the silicon nitride film 51 and the silicon oxide film 50 are removed by etching to expose the silicon substrate 11 in the device formation regions 12. Then, the exposed surface is heated by thermal oxidation to form the first gate oxide film 21 thereon. Thereafter, the polysilicon film 22 to be the floating gate 22a is deposited over the entire surface. Then, a photolithography technology is employed to remove the polysilicon film 22 from above the device-isolation insulator films 31 and 32.

Figure 23:
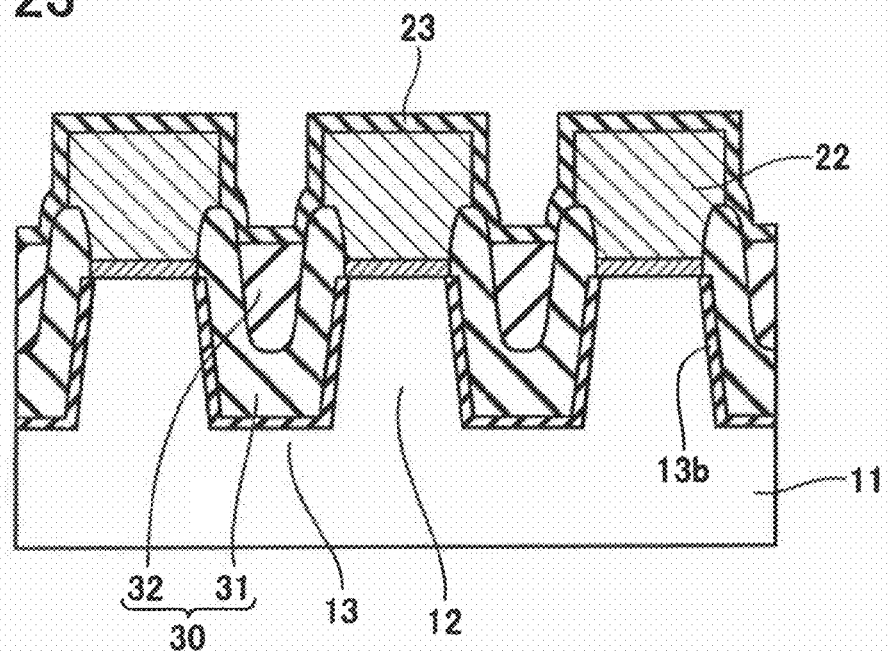
FIG. 23 shows a specific step of processing the NAND-type EEPROM according to the second embodiment.

Then, as shown in FIG. 23, a certain thick ONO film is formed as the second gate insulator film 23 on the upper surface and sides of the polysilicon film 22 and on the first and second device-isolation insulator films 31 and 32 using a low pressure CVD method. In the region for forming the selection transistor 3 therein, the second gate insulator film 23 is partly removed to short-circuit between the polysilicon film 22 and the control gate 26.

Figure 24:
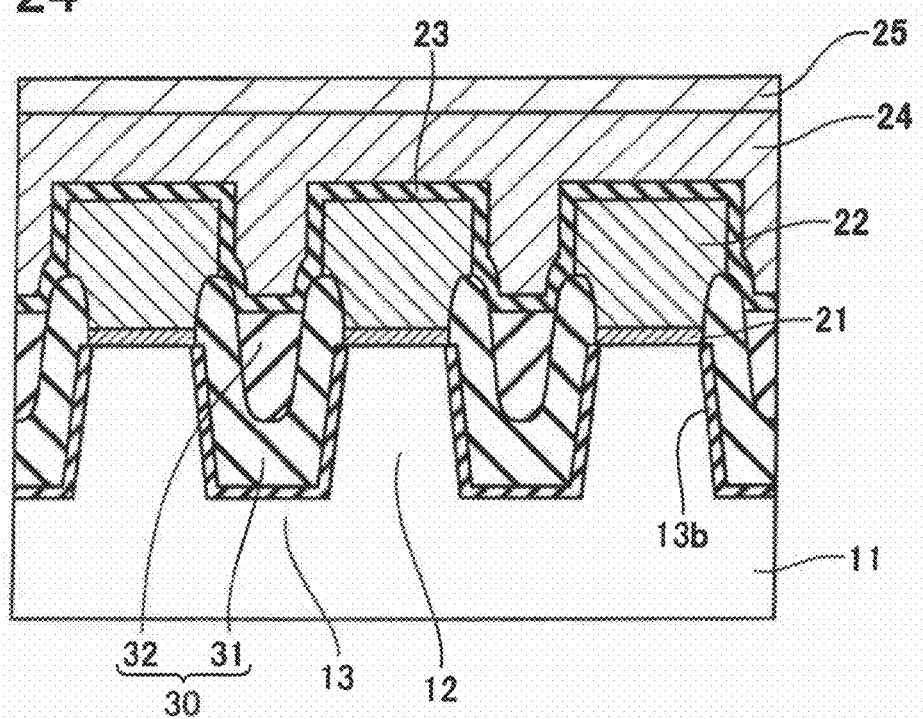
FIG. 24 shows a specific step of processing the NAND-type EEPROM according to the second embodiment.

Subsequently, as shown in FIG. 24, the polysilicon film 24 and the tungsten silicide film 25 are formed on the second gate insulator film 23 in turn as the material for the control gate 26.

Figure 25A:
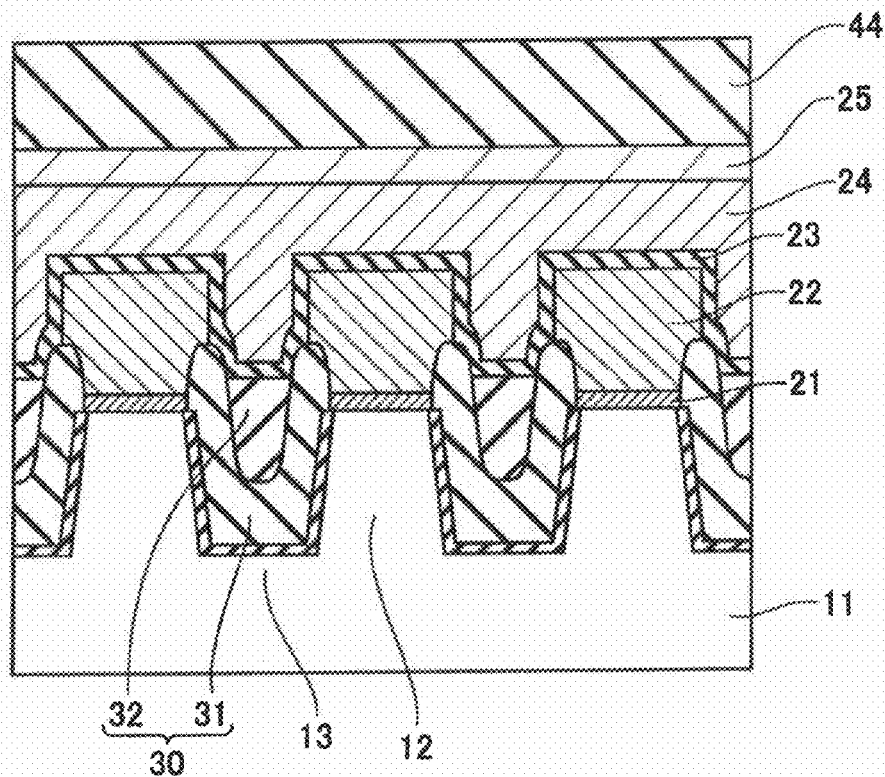
FIG. 25A shows a specific step of processing the NAND-type EEPROM according to the second embodiment.
Figure 25B:
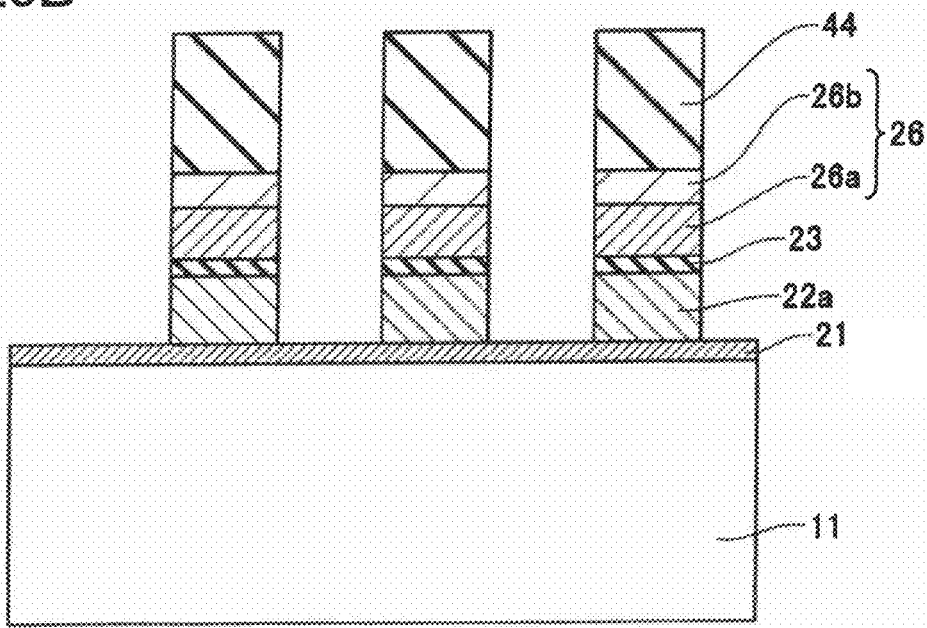
FIG. 25B shows a specific step of processing the NAND-type EEPROM according to the second embodiment.

Next, as shown in FIGS. 25A and 25B, a mask pattern 44 of silicon nitride film is formed. The mask pattern 44 extends in a direction perpendicular to the direction of the device isolation trench 13 extending. The mask pattern 44 is employed as an etching mask to pattern the tungsten silicide film 25, the polysilicon film 24, the second gate insulator film 23 and the polysilicon film 22. As a result, the polysilicon film 22 is shaped in the form of the floating gate 22a in each memory cell 2. In addition, the polysilicon films 24 and 25 are shaped in the forms of the films 26a and 26b contained in the control gate 26.

Thereafter, removal of the silicon nitride film 44 by phosphoric acid treatment; formation of the source-drain diffusion layers 14a, 14b and 14c by ion implantation and thermal diffusion; formation of an interlayer insulator film 41 by low pressure CVD; and formation of the bit lines 1 are performed to complete the cell array in the NAND-type EEPROM as shown in FIGS. 15A and 15B.

Figure 26:
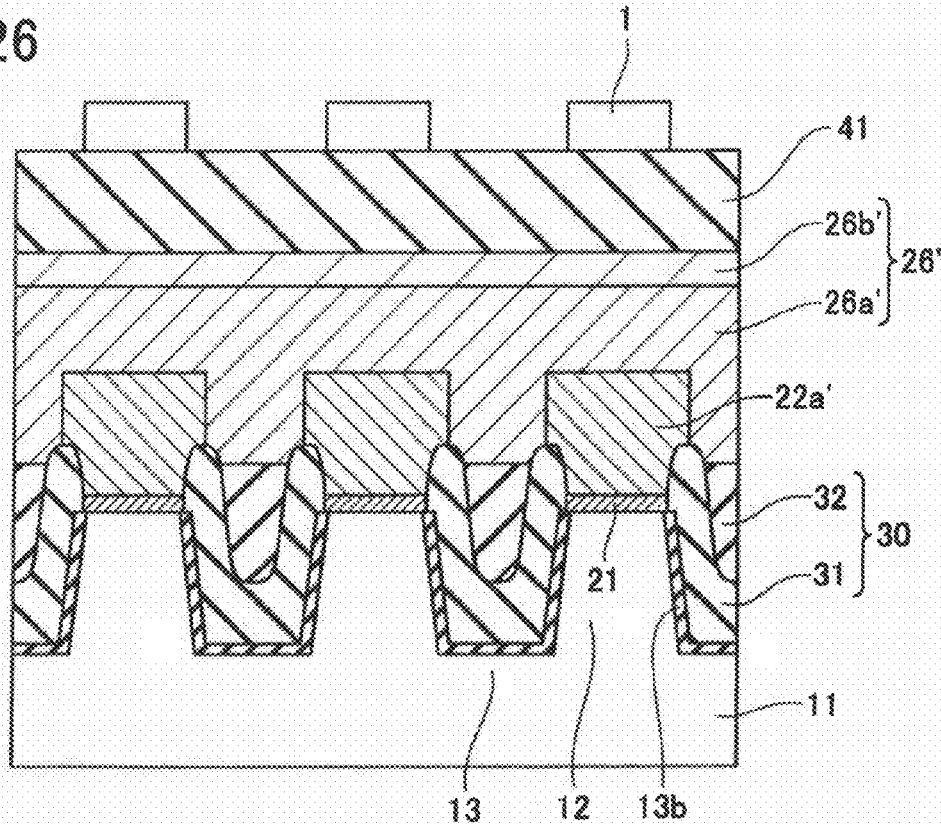
FIG. 26 shows a structure of selection transistors in the NAND-type EEPROM according to the second embodiment.

A sectional structure of the selection transistor 3 (C-C section in FIG. 1) is described with reference to FIG. 26. Also in this embodiment, the selection transistor 3 is structured to short-circuit between the polysilicon film 22' and the control gate 26' like in the first embodiment (FIG. 13). The device isolation trench 13 continues to the region for forming the memory cell 2. The device-isolation insulator film 30 composed of the first and second device-isolation insulator films 31 and 32 also has the same structure that continues from the region for forming the memory cell 2.

Figure 27:
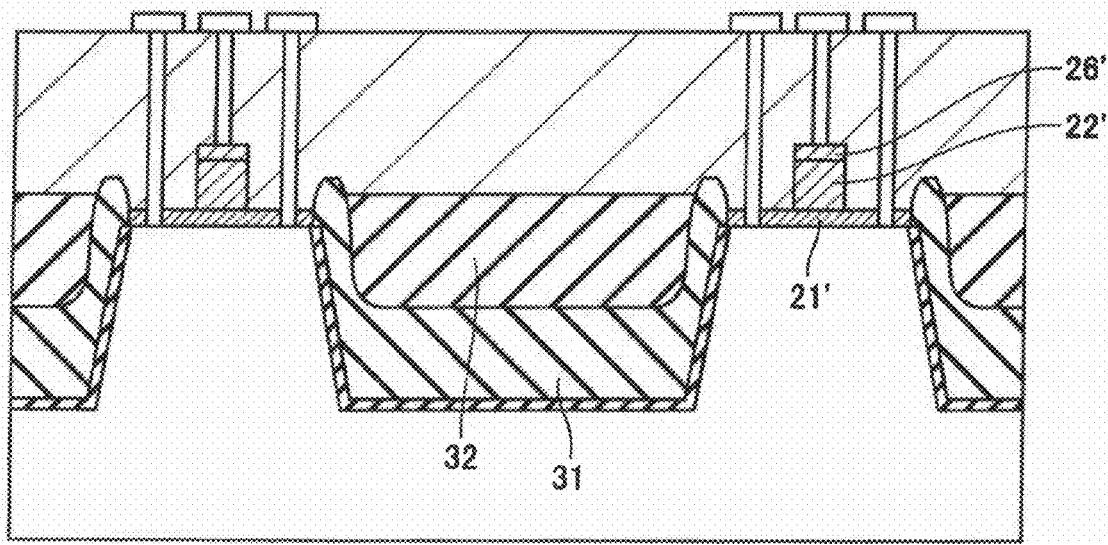
FIG. 27 shows an example of transistors for configuring a peripheral circuit in the NAND-type EEPROM according to the second embodiment.

A structural example of transistors for configuring a peripheral circuit in the NAND-type EEPROM according to the second embodiment is described with reference to FIG. 27. A transistor contained in the peripheral circuit has a gate, which is composed of the first gate insulator film 21p, the polysilicon film 22', and the polysilicon film 26'. These components may be composed of the same films as those of the portions 22a and 26 in the memory cell 2. The device-isolation insulator film 30 formed in a device isolation trench 13' for defining a device region 12' of the transistor contained in the peripheral circuit is formed simultaneously with that in the memory cell region and has the same structure as that of the memory cell region.

Namely, the first device-isolation insulator film 31 is shaped in the form of a recess, and the second device-isolation insulator film 32 is formed in the recess.

Figure 28:
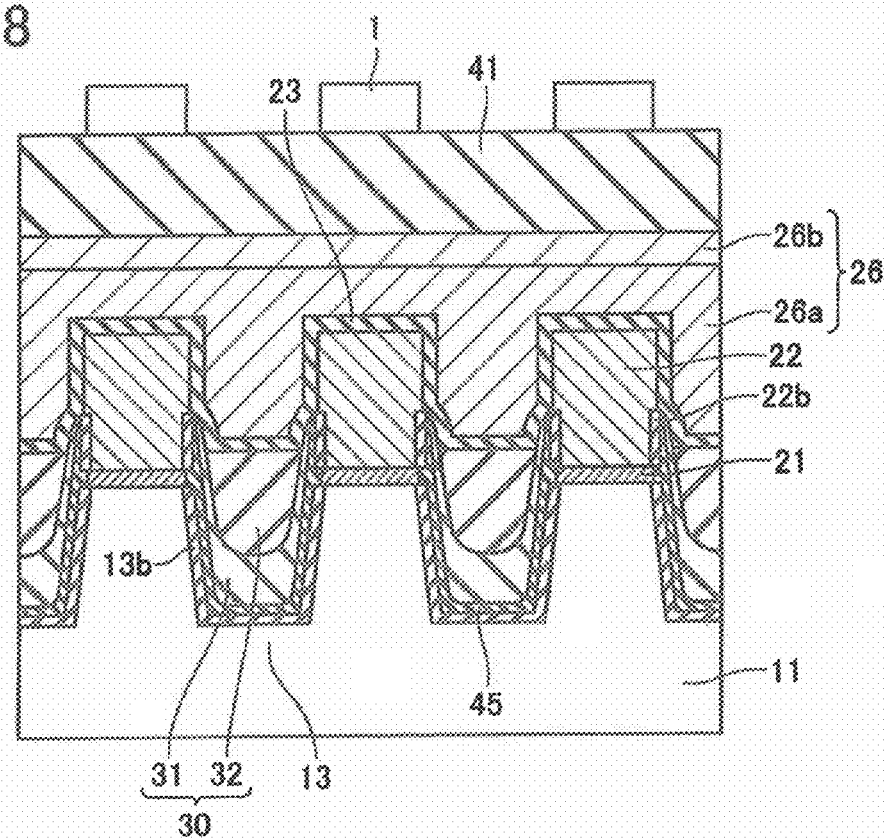
FIG. 28 shows one of alternatives of the first and second embodiments.

The embodiments of the invention have been described above while the present invention is not limited to these embodiments but rather can be given various modifications, additions and replacements without departing from the scope and spirit of the invention. For example, in the above embodiments the oxide films 22b and 13b are formed on the sides of the polysilicon film 22 and on the side and bottom in the device isolation trench 13 by thermal oxidation, though this step can be omitted if the etching damage is little. To the contrary, after formation of the oxide films 22b and 13b, as shown in FIG. 28, a HTO film 45 may further be formed on the oxide film 13b to form the first device-isolation insulator film 31 on the HTO film 45.

Figure 29:
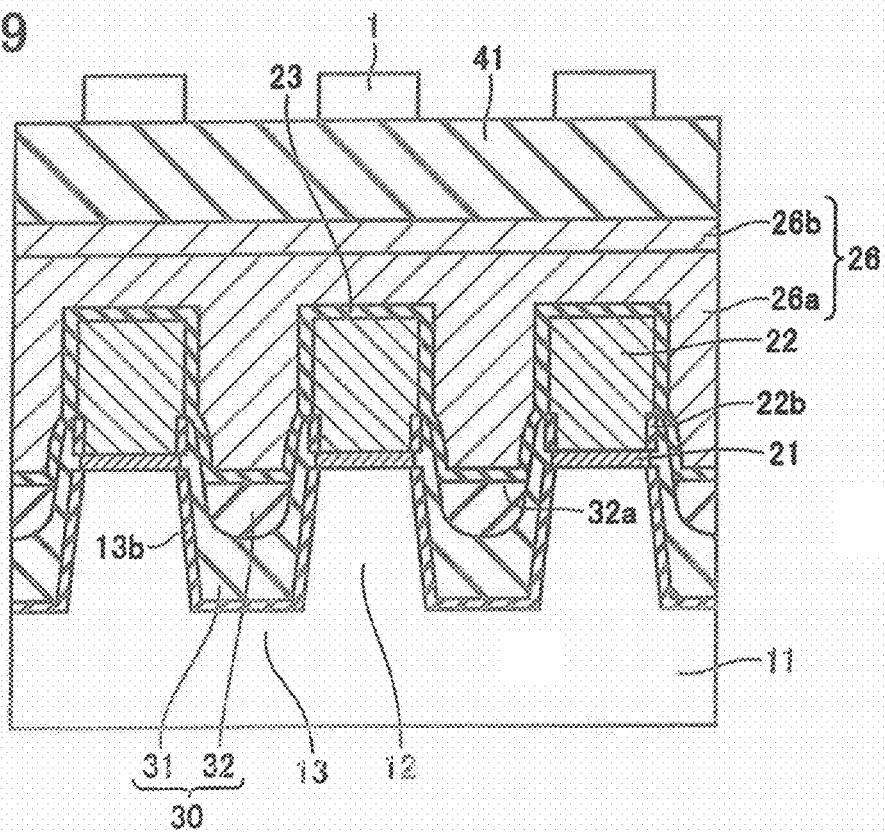
FIG. 29 shows one of alternatives of the first and second embodiments.
Figure 30:
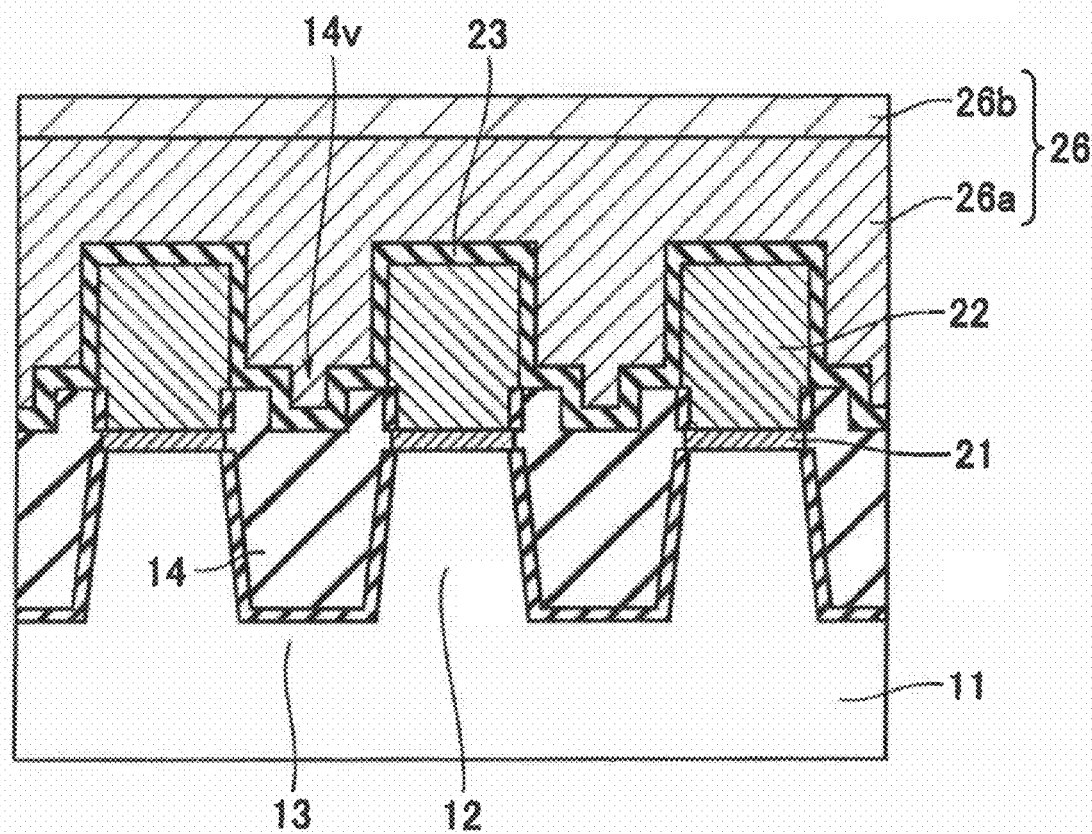
FIG. 30 shows a configuration of an NAND-type EEPROM according to the prior art.

In the above embodiments, the upper surface 32a of the second device-isolation insulator film 32 is located higher than the first gate insulator film 21. To the contrary, as shown in FIG. 29, the upper surface 32a may be located lower than the first gate insulator film 21. This structure is effective to further reduce the possibility of capacitive coupling between the floating gates 22a.

In comparison with the above embodiments, the structure of FIG. 29 locates the control gate 26 closer to the silicon substrate 11 while remaining at least the extension 31e of the first device-isolation insulator film 31 and the second gate insulator film 23 between both. Thus, even the structure of FIG. 29 can retain a sufficiently high breakdown voltage across the control gate 26 and the silicon substrate 11.

In the above embodiments, as shown in FIG. 2A, for example, the recess 35 is entirely filled with the control gate 26. In contrast, the control gate 26 may be formed only on the inner surface of the recess 35 to fill the recess 35 only partly. Even this structure can reduce the capacitive coupling between the floating gates 22a.

In the above embodiments, the CVD-insulator film is employed as the first device-isolation insulator film 31, and the polysilazane-applied densified film is employed as the second device-isolation insulator film 32. This is just an example. If the second device-isolation insulator film 32 has an etching rate determined higher than that of the first device-isolation insulator film 31, various other materials may be selected as the materials for the films 31 and 32.

The present invention is applicable to a non-volatile semiconductor memory device of the type that stores data of one bit in each memory cell as well as a non-volatile semiconductor memory device of the type that stores data of multiple bits in each memory cell.

The invention claimed is:

1. A non-volatile semiconductor memory device, comprising:
 a semiconductor substrate having device formation regions defined by device isolation trenches;
 a first gate insulator film formed over said device formation regions;
 a floating gate formed on said first gate insulator film;
 a first device-isolation insulator film formed in said device isolation trenches and having recesses thereon, and contacted with the floating gate;

a second device-isolation insulator film formed in said recesses;

a second gate insulator film formed over a surface of said floating gate and said first and second device-isolation insulator films; and a control gate formed above said floating gate and said first and second device-isolation insulator films via said second gate insulator film, wherein the uppermost portions at both ends of said first device-isolation insulator film are located higher than the uppermost portions at both ends of said second device-isolation insulator film, wherein said second device-isolation insulator film is higher in etching rate than said first device-isolation insulator film under a certain etching condition.

2. The non-volatile semiconductor memory device according to claim 1, wherein said uppermost portion of said second device-isolation insulator film is located higher than a lower surface of said floating gate.

3. The non-volatile semiconductor memory device according to claim 2, wherein said uppermost portion of said first device-isolation insulator film is located lower than the uppermost portion of said floating gate.

4. The non-volatile semiconductor memory device according to claim 1, wherein said first device-isolation insulator film comprises a silicon oxide film, and wherein said second device-isolation insulator film comprises a polysilazane film.

5. The non-volatile semiconductor memory device according to claim 1, further comprising insulator films formed on at least sides of said device isolation trenches.

6. The non-volatile semiconductor memory device according to claim 1, wherein said second gate insulator film comprises a triple-layered lamination of a first silicon oxide film, a silicon nitride film and a second silicon oxide film.

7. The non-volatile semiconductor memory device according to claim 1, further comprising a selection transistor formed in said device formation region and connected via a bit line to a memory cell, wherein said device isolation trench for defining said device formation region employed to form said selection transistor therein is similarly structured as said device isolation trench for defining said device formation region employed to form said memory cell therein.

8. The non-volatile semiconductor memory device according to claim 1, further comprising a peripheral semiconductor device formed in said device formation region and connected to a memory cell, wherein said device isolation trench for defining said device formation region employed to form said peripheral semiconductor device therein is similarly structured as said device isolation trench for defining said device formation region employed to form said memory cell therein.

9. The non-volatile semiconductor memory device according to claim 1, wherein the second gate insulator film is continuously formed over a surface of said floating gate, said first device-isolation insulator film, and said second device-isolation insulator film.

* * * * *